United States Patent
Hammad et al.

(10) Patent No.: US 12,385,147 B2
(45) Date of Patent: Aug. 12, 2025

(54) POLYMER ELECTROLYTE MEMBRANE (PEM) ELECTROLYTIC CELLS USING ZEOLITE-TEMPLATED CARBON (ZTC) AS ELECTROCATALYST

(71) Applicant: Saudi Arabian Oil Company, Dhahran (SA)

(72) Inventors: Ahmad D. Hammad, Dhahran (SA); Issam T. Amr, Al Khobar (SA); Yuguo Wang, Dhahran (SA); Georgios Lithoxoos, Dhahran (SA); Rashid M. Othman, Al Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 866 days.

(21) Appl. No.: 17/450,416

(22) Filed: Oct. 8, 2021

(65) Prior Publication Data
US 2023/0023125 A1 Jan. 26, 2023

(30) Foreign Application Priority Data
Jul. 14, 2021 (GR) ............................... 20210100469

(51) Int. Cl.
*C25B 9/23* (2021.01)
*C23C 16/01* (2006.01)
(Continued)

(52) U.S. Cl.
CPC ............... *C25B 9/23* (2021.01); *C23C 16/01* (2013.01); *C23C 16/02* (2013.01); *C23C 16/26* (2013.01);
(Continued)

(58) Field of Classification Search
CPC ............ C25B 1/04; C25B 1/042; C25B 1/044
See application file for complete search history.

(56) References Cited

U.S. PATENT DOCUMENTS 1,511,001 A   10/1924   Padden
1,512,001 A   10/1924   Cerny
(Continued)

FOREIGN PATENT DOCUMENTS

EP   1808920   7/2007
EP   2673083   12/2013
(Continued)

OTHER PUBLICATIONS

Cai et al, Large Surface Area Ordered Porous Carbons via Nanocasting Zeolite 10X and High Performance for Hydrogen Storage Application, ACS Applied Materials & Interfaces, vol. 6, No. 1, Dec. 2013, pp. 167-175 (Year: 2013).*
(Continued)

*Primary Examiner* — Harry D Wilkins, III
(74) *Attorney, Agent, or Firm* — Fish & Richardson P.C.

(57) ABSTRACT

A polymer electrolyte membrane (PEM) electrolytic cell assembly, and a method for making the assembly, are provided. An exemplary method includes forming a functionalized zeolite templated carbon (ZTC), including forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites, forming the functionalized ZTC. The method further includes incorporating the functionalized ZTC into electrodes, forming a membrane electrode assembly (MEA), and forming the PEM electrolytic cell assembly. The method further includes coupling the PEM electrolytic cell assembly to a heat source.

15 Claims, 10 Drawing Sheets

(51) Int. Cl.

| | |
|---|---|
| *C23C 16/02* | (2006.01) |
| *C23C 16/26* | (2006.01) |
| *C23C 16/455* | (2006.01) |
| *C25B 1/04* | (2021.01) |
| *C25B 9/63* | (2021.01) |
| *C25B 9/65* | (2021.01) |
| *C25B 9/67* | (2021.01) |
| *C25B 11/031* | (2021.01) |
| *C25B 11/052* | (2021.01) |
| *C25B 11/065* | (2021.01) |
| *C25B 11/073* | (2021.01) |
| *C25B 13/08* | (2006.01) |

(52) U.S. Cl.
CPC .......... *C23C 16/45523* (2013.01); *C25B 1/04* (2013.01); *C25B 9/63* (2021.01); *C25B 9/65* (2021.01); *C25B 9/67* (2021.01); *C25B 11/031* (2021.01); *C25B 11/052* (2021.01); *C25B 11/065* (2021.01); *C25B 11/073* (2021.01); *C25B 13/08* (2013.01)

(56) References Cited

U.S. PATENT DOCUMENTS

| | | | |
|---|---|---|---|
| 2,092,316 | A | 9/1937 | Lane |
| 3,487,484 | A | 1/1970 | Holmes |
| 4,855,820 | A | 8/1989 | Barbour |
| 5,944,195 | A | 8/1999 | Huang et al. |
| 7,842,200 | B2 | 11/2010 | Ehrman et al. |
| 2005/0241825 | A1 | 11/2005 | Timmins et al. |
| 2006/0157239 | A1 | 7/2006 | Ramos et al. |
| 2011/0253373 | A1 | 10/2011 | Kumar et al. |
| 2015/0236354 | A1* | 8/2015 | Binder .................. H01M 4/925 502/159 |
| 2016/0320769 | A1 | 11/2016 | Deffenbaugh et al. |
| 2016/0351916 | A1 | 12/2016 | Birss et al. |
| 2018/0023202 | A1 | 1/2018 | Krause et al. |
| 2020/0385879 | A1* | 12/2020 | Haug .................. B01J 37/0215 |
| 2021/0079546 | A1* | 3/2021 | Wakita ..................... C25B 1/02 |

FOREIGN PATENT DOCUMENTS

| | | |
|---|---|---|
| EP | 3835457 | 6/2021 |
| JP | 5861492 | 2/2016 |
| WO | WO 2004023581 | 3/2004 |

OTHER PUBLICATIONS

Yang et al., "Effect of functionalization for carbon molecular sieve (CMS) synthesized using zeolite template on the incorporation of Pt nanoparticle and performance of the electrodes in PEMFC," Microporous and Mesoporous Materials, 2012, 152:148-156, 9 pages.

PCT International Search Report and Written Opinion in International Appln. No. PCT/US2022/073483, dated Nov. 28, 2022, 14 pages.

U.S. Appl. No. 17/450,406, Birss et al., filed Dec. 1, 2016.
U.S. Appl. No. 17/497,521, Hammad et al., filed Oct. 8, 2021.
U.S. Appl. No. 17/497,556, Hammad et al., filed Oct. 8, 2021.

Catalyst Preparation: Science and Engineering, Regalbuto, CRC Press, Taylor & Francis Group, 2007, 491 pages.

High-temperature Solid Oxide Fuel Cells: Fundamentals, Design and Applications, Singhal et al., Elsevier Science, 2003, pp. 7-16.

Kan et al., "Trends in electrode development for next generation solid oxide fuel cells," Journal of Materials Chemistry A, 2016, 4(46), 20 pages.

Kumar et al., "Hydrogen production by PEM water electrolysis—A review," Materials Science for Energy Technologies, 2019, 2:442-454, 13 pages.

Lu et al., "Zeolite-templated nanoporous carbon for high performance supercapacitors," Journal of Materials Chemistry A, 2018, 6:10388, 9 pages.

Marie et al., "Highly dispersed platinum on carbon aerogels as supported catalysts for PEM fuel cell-electrodes: comparison of two different synthesis paths," Journal of Non-Crystalline Solids, 2004, 350:88-96, 9 pages.

Marie et al., "Highly porous PEM fuel cell cathodes based on low density carbon aerogels as Pt-support: Experimental study of the mass-transport losses," Journal of Power Sources, May 2009, 190(2):423-434, 12 pages.

Marie et al., "Platinum supported on resorcinol-formaldehyde based carbon aerogels for PEMFC electrodes: Influence of the carbon support on electrocatalytic properties," Journal of Applied Electrochemistry, 2007, 37:147-153, 7 pages.

Miao et al., "Revival of Zeolite-Templated Nanocarbon Materials: Recent Advances in Energy Storage and Conversion," Advanced Science, 2020, 7:2001335, 32 pages.

Ogungbemi et al., "Review of operating condition, design parameters and material properties for proton exchange membrane fuel cells," International Journal of Energy Research, Feb. 2021, 45(2):1227-1245, 19 pages.

Stadie et al., "Zeolite-Templated Carbon as an Ordered Microporous Electrode for Aluminum Batteries," ACS Nano, 2017, 11:1911-1919, 9 pages.

Wang et al., "Hydrogen production by catalytic dehydrogenation of tetralin and decalin over stacked cone carbon nanotube-supported Pt catalysts," Energy & Fuels, 2006, 20:2612-2615, 4 pages.

Wang et al., "Pure hydrogen production by partial dehydrogenation of cyclohexane and methylcyclohexane over nanotube-supported Pt and Pd catalysts," Energy & Fuels, 2004, 18:1429-1433, 5 pages.

wikipedia.com [online], "Solid oxide electrolyzer cells," available on or before Aug. 6, 2020 via Internet Archive Wayback Machine URL<https://web.archive.org/web/20200806055040/https://en.wikipedia.org/wiki/Solid_oxide_electrolyzer_cell>, retrieved on Nov. 11, 2021, retrieved from URL <https://en.wikipedia.org/wiki/Solid_oxide_electrolyzer_cell>, 7 pages.

\* cited by examiner

300

POLYMER ELECTROLYTE MEMBRANE (PEM) ELECTROLYTIC CELLS USING ZEOLITE-TEMPLATED CARBON (ZTC) AS ELECTROCATALYST

CROSS-REFERENCE TO RELATED PATENT APPLICATIONS

This application claims the benefit of priority to Greek Application No. 20210100469, filed Jul. 14, 2021, the contents of which are incorporated by reference herein.

TECHNICAL FIELD

The present disclosure is directed to enhancing the performance of polymer electrolyte membrane (PEM) electrolytic cells by using zeolite-templated carbon (ZTC) as electrocatalyst.

BACKGROUND

Electrolytic cells are an alternative energy technology that generates hydrogen from water for storage of energy. The electrolytic cells may use power from renewable sources, such as wind turbines, solar cells, or hydroelectric power. Alternatively, the electrolytic cells may use power from nuclear reactors, or power generated from waste energy at chemical processing facilities or refineries. Each individual electrolytic cell contains three primary components: two electrodes (anode and cathode) and a conductive electrolyte.

Proton exchange membrane (PEM) electrolytic cells, also referred to as polymeric electrolyte membrane electrolytic cells, is a type of electrolyzer that has the major advantage of operating at relatively low temperatures, for example, from about 35° C. to about 160° C. Accordingly, less heat may be needed to heat the electrolytic cell to operating temperatures than other types of electrolyzers. In the case of PEM electrolytic cells, each electrode is comprised of a porous, high-surface area material impregnated with an electrocatalyst, typically platinum or a platinum alloy. The electrolyte material is a polymeric membrane, which serves as an ionic conductor and electrical insulator, for example, allowing $H^+$ ions to move from the anode to the cathode while blocking electron flow from anode to cathode.

PEM electrolytic cells have the further advantage that they may be reversible. Thus, the PEM electrolytic cells may be used as PEM electrolytic cells when energy demand is high, then return to use as electrolytic cells when excess power is available.

SUMMARY

An embodiment described in examples herein provides a method for making a polymer electrolyte membrane (PEM) electrolytic cell assembly. The method includes forming a functionalized zeolite templated carbon (ZTC), including forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites, forming the functionalized ZTC. The method further includes incorporating the functionalized ZTC into electrodes, forming a membrane electrode assembly (MEA), and forming the PEM electrolytic cell assembly. The method further includes coupling the PEM electrolytic cell assembly to a heat source.

Another embodiment described in examples herein provides a polymer electrolyte membrane electrolytic cell. The polymer electrolyte membrane electrolytic cell includes a membrane electrode assembly (MEA) that includes an anode, a polymer electrolyte membrane (PEM), and a cathode, wherein the anode, the cathode, or both includes functionalized zeolite templated carbon (ZTC). The PEM electrolytic cell also includes a housing including an inlet for water and an outlet for hydrogen and a power line coupled to the cathode to provide current to the PEM electrolytic cell from an external power supply. The PEM electrolytic cell includes a return line from the external device coupled to the anode.

DETAILED DESCRIPTION

Reducing the noble metal content of electrolytic cells, including polymer electrolyte membrane (PEM) electrolytic cells, is an important goal of research in electrochemistry, materials science and catalysis, as a decrease in metals will lower the costs of electrolytic cells. The current performance of PEM electrolytic cells is limited by slow electrocatalysis at the noble metal site on the anode and the cathode (e.g., activation overpotential), slow proton migration in the PEM (e.g., ohmic overpotential), or slow mass transfer at the anode and cathode (e.g., diffusion overpotential).

Embodiments described herein provide polymer electrolyte membrane electrolytic cells that include electrodes using zeolite templated carbon (ZTC) in contact with anodes or cathodes to provide high electrocatalytic activity. The ZTC is used to support catalytic materials, such as noble metals, among others. As the ZTC, or microporous carbon, has a high surface area the amount of noble metal used as catalyst may be reduced. Further, the high surface area of the ZTC increases the available area for reduction and oxidation over flat surfaces. In addition, the ZTC exhibits high ion conductivity and high electronic conductivity.

Figure 1:
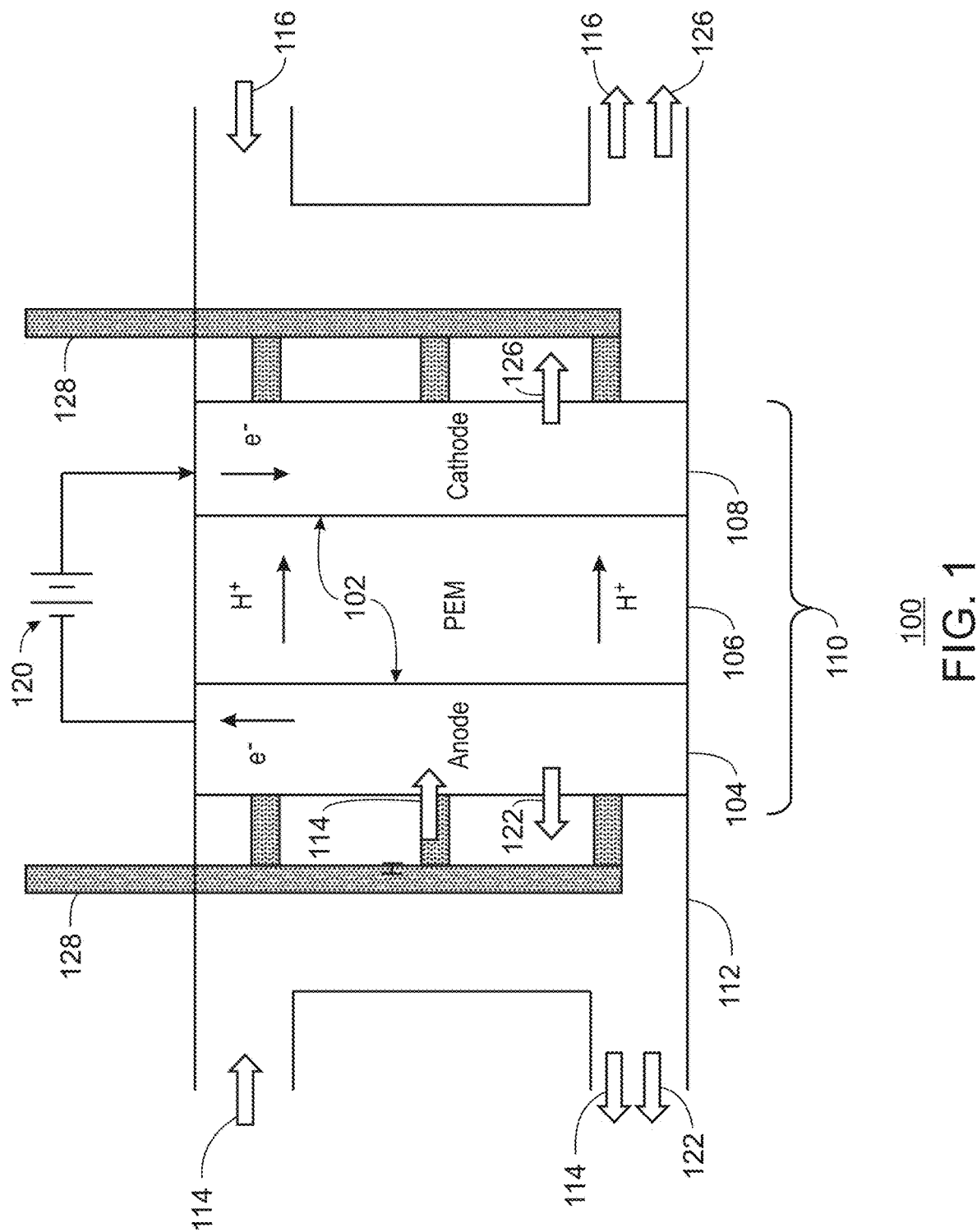
FIG. 1 is a schematic drawing of a PEM electrolytic cell using ZTC supported catalyst at the interfaces between the anode and the PEM and between the PEM and the cathode.

FIG. 1 is a schematic drawing of a PEM electrolytic cell 100 using ZTC supported catalyst at the interfaces 102 between the anode 104 and the PEM 106 and between the PEM 106 and the cathode 108. As used herein, the anode 104, PEM 106, and cathode 108, with the ZTC supported catalyst layers, forms a membrane electrode assembly (MEA) 110, which is supported in a housing 112 that includes an inlet for water 114. In some embodiments, a sweep gas 116, may also be introduced. In some embodiments, the water 114 is introduced as a vapor, such as low temperature steam. The steam may be used to maintain the electrolytic cell at operating temperature, as the electrolysis of water is an endothermic process.

In some embodiments, the housing includes a system 128 for adding heat to bring the electrolytic cell up to operating temperature, such as steam coils, solar heating facilities, and the like. If the PEM electrolytic cell 100 is used in reversible operation, heat generated during operation as a fuel cell may be stored for use during electrolysis. For example, in an embodiment, the heat generated during operation as a fuel cell is stored in a reservoir as a molten salt, which is pumped through the PEM electrolytic cell 100 to provide heat during electrolysis.

The catalyst supported on the functionalized ZTC located at the interfaces 102, lowers the activation energy of the half-cell reactions. As the ZTC has a very high surface area, less catalyst may be used than in other PEM electrolytic cells.

Figure 2:
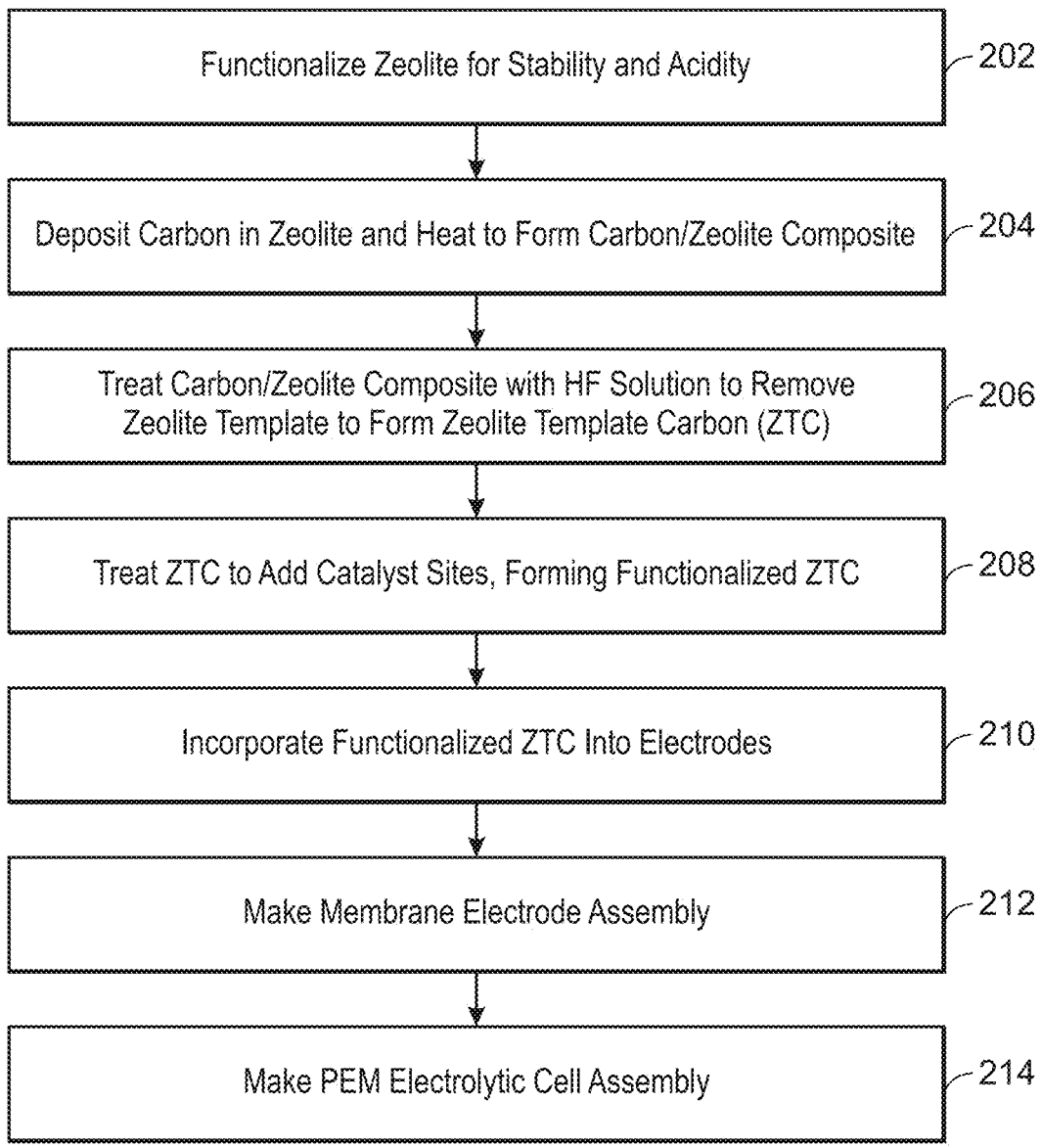
FIG. 2 is a process flow diagram of a method for making a polymer electrode membrane electrolytic cell assembly.

FIG. 2 is a process flow diagram of a method 200 for making a polymer electrode membrane electrolytic cell. The method 200 begins at block 202 with the ion-exchanging of an NaX zeolite with $Ca^{2+}$ ions to form a CaX zeolite. Although zeolite X is described in detail herein, other zeolites may be used in embodiments, including, for example, zeolite Y, or zeolite BAU, among others. The selection of the zeolite, and any treatments used, such as ion exchange, may be based on the temperature stability and pore size of the zeolite.

At block 204, carbon is deposited in the zeolite to form a carbon/zeolite composite. In various embodiments, a chemical vapor deposition (CVD) process to deposit carbon in the zeolite by exposing the zeolite to an organic precursor gas at an elevated temperature, which deposits carbon in the pores of the zeolite. After deposition, the zeolite containing the deposited carbon is heated to carbonize the deposited carbon, forming a carbon/zeolite composite. In embodiments described herein, carbon is deposited in CaX zeolite by exposing the CaX zeolite to propylene, ethanol, or acetylene in mixtures with helium. In various embodiments, temperatures for the deposition and heat treatment range are between about 820 K and 1125 K. In some embodiments, deposition temperatures are between about 820 K and about 975 K. In one embodiment, the deposition temperature is about 823 K. In another embodiment, the deposition temperature is about 873 K.

At block 206 the carbon/zeolite composite is treated with an aqueous acid solution that includes HF to remove the CaX template forming zeolite template carbon (ZTC). In various embodiments, the aqueous acid solution includes HF and HCl, in approximately equal amounts. In various embodiments, the aqueous acid solution includes about 2 wt. % of each of HF and HCl, about 3 wt. % of each of HF and HCl, or about 4 wt. % of each of HF and HCl.

At block 208, the ZTC is treated to add catalyst sites, forming functionalized ZTC. To serve as electrode or electro catalyst, an oxide, a metal or a metal oxide is added to the ZTC. This can be performed by a number of techniques known in the art, including wet impregnation, sputtering, sputter-deposition, doping, chemical functionalization, thermal coating or electrochemical coating, among others. In some embodiments, this is performed by an incipient wetness technique.

Incipient wetness impregnation (IW or IWI), also called capillary impregnation or dry impregnation, is a commonly used technique for the synthesis of heterogeneous catalysts. Typically, the active metal precursor is dissolved in an aqueous or organic solution. Then the metal-containing solution is added to a catalyst support containing the same pore volume as the volume of the solution that was added. Capillary action draws the solution into the pores. Solution added in excess of the support pore volume causes the solution transport to change from a capillary action process to a diffusion process, which is much slower. The catalyst can then be dried and calcined to drive off the volatile components within the solution, depositing the metal on the catalyst surface. The maximum loading is limited by the solubility of the precursor in the solution. The concentration profile of the impregnated compound depends on the mass transfer conditions within the pores during impregnation and drying.

At block 210, the functionalized ZTC is incorporated into electrodes. This may be performed by impregnation, suction impregnation, chemical crosslinking, or using a conducting adhesive. For example, in an embodiment the functionalized ZTC is adhered to the electrodes using ion conductive adhesive formed from a perfluorinated resin binder and isopropyl alcohol.

In other embodiments, an electrode can be prepared including a metal and metal oxide anode by metal sputtering. The functionalized ZTC can be introduced into the sputtering chamber. A thin metal film can be sputter-deposited first, and a second layer of metal oxide including the functionalized ZTC can be deposited over the metal film. In various embodiments, a magnetron sputtering system is used for the depositions. High purity argon and oxygen can be used as sputtering and reactive gas, respectively.

At block 212, a membrane electrode assembly is formed. This may be performed by hot pressing the electrodes that incorporate the functionalized ZTC to the PEM, forming a single block. In some embodiments, current collectors are formed into the block with the electrodes and PEM. Other techniques may be used to make the membrane electrode assembly, including, for example, using ion conductive adhesives to adhere the parts to each other.

At block 214, a PEM electrolytic cell assembly is formed. In various embodiments, this is performed by mounting the membrane electrode assembly (MEA) in a housing, which has an inlet for water and an outlet for hydrogen. In some embodiments, the housing has coils for heating, for example, by steam, waste heat from other processes, solar heat, and the like. The MEA is sealed to the housing, for example, using a high temperature sealant such as a silicone adhesive, among others. This prevents gases from the hydrogen side from contacting the oxygen side. In some embodiments, a number of housing units are stacked to increase hydrogen productivity. In various embodiments, a heating system is coupled to heat source to keep the temperature of the electrolytic cell at the operating temperature.

EXAMPLES

Electrode Preparation Steps:
  Synthesis of Zeolite-templated Carbon (ZTC) on the electrolyte (ionic conductors).

Carbon Replication of CaX Zeolite

CaX zeolite was prepared by ion-exchanging NaX (commercial zeolite, not ultra-large crystal) with $Ca^{2+}$ by stirring 10 g sample in 200 mL of 0.32 M $Ca(NO_3)_2$ solution for 4 h. $Ca^{2+}$ exchange can generate acid sites in zeolite which catalyze the carbon deposition inside zeolite micropores and also increases the thermal stability of zeolite template during the conditions used for the CVD.

Figure 3:
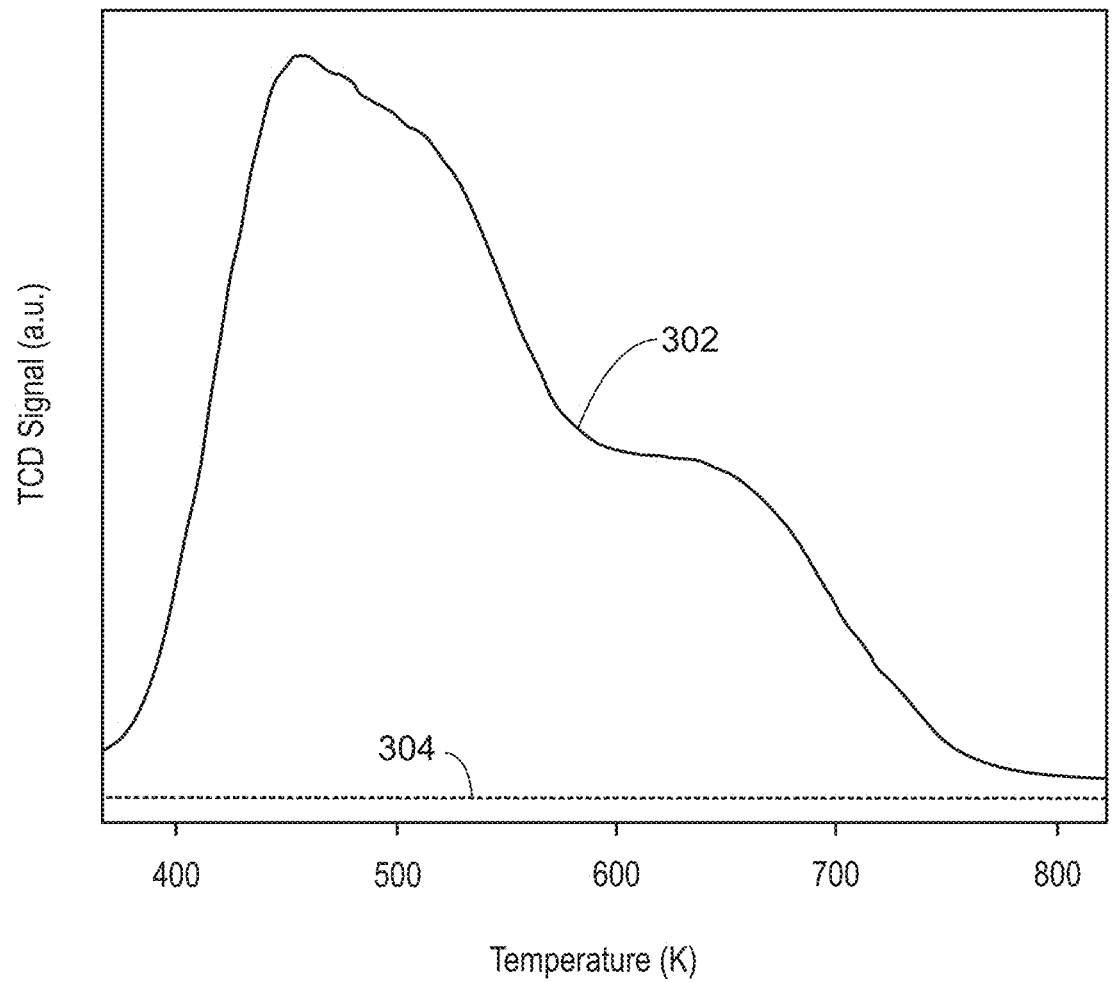
FIG. 3 is a plot comparing $NH_3$ TPD (temperature programmed desorption) profiles of CaX and commercial NaX.

FIG. 3 is a plot 300 comparing $NH_3$ TPD (Temperature Programmed Desorption) profiles of CaX 302 and commercial NaX 304. The plot 300 shows that the ion-exchange of an NaX zeolite with $Ca^{2+}$ can generate acidity. This helps with the selective carbon deposition in micropores and enhances the thermal stability of zeolite template.

In the plot 300, the CaX 302 shows two desorption peaks, at 473 and 653 K, indicating the presence of two types of acid sites. In contrast, the NaX tool for does not show any desorption profile, indicating no acidity.

As shown in Table 1, the CaX zeolite also has a higher thermal stability than NaX, wherein the crystallinity does not change at temperatures up to 973 K. The thermal stability is useful, as the carbon deposition condition uses a chemical vapor deposition (CVD) at temperatures of 873~973 K.

TABLE 1

Thermo stability of NaX, CaX zeolites

| Sample | $A_z$[1] | $T_{init}$[2] (K) | $T_{0.5}$[3] (K) |
|---|---|---|---|
| NaX | 1 | 933 | 1043 |
| CaX | 0.93 | 983 | 1153 |

[1]Equivalent fraction of exchange cation in zeolite.
[2]Temperature at which structural degradation is first observed from the X-ray powder pattern, in K.
[3]Temperature at which the structure is 50% decomposed, in K.

Carbon Deposition in Zeolites

The carbon deposition in the X zeolites was carried out in a conventional plug-flow reactor. Typically, 1 g NaX or CaX sample was placed in plug flow reactor and the temperature was increased to a specified temperature under He flow. For example, a temperature range of about 823 K to about 973 K is suitable to selectively deposit carbon in zeolite micropores. In some embodiments using NaX and propylene the temperature is 973 K. After the temperature was allowed to stabilize for 30 min, the gas was switched to an organic precursor gas. Three different organic precursor gases were used for the carbon deposition. The organic precursor gases were propylene, ethanol, and acetylene with respective kinetic diameters of 0.45, 0.45 and 0.33 nm. These were used in mixtures, with the propylene added as a 2% propylene/He (200 mL/min·g) mixture. The ethanol was added as a helium gas flow (200 mL/min·g) that was saturated with ethanol at room temperature, using bubbler, 6 kPa. The acetylene was added as a 2 vol. % acetylene/He gas (200 mL/min·g) mixture. After flowing the organic precursor gas for the specified time, the gas was switched to He and the reactor was cooled to room temperature. The incorporation of the organic precursor gas into the zeolite resulted in a zeolite/carbon composite.

Removing the Zeolite Template

To remove the zeolite template and format the microporous carbon, the zeolite/carbon composite was treated with a water solution of HCl and HF (3.4 wt. % HCl/3.3 wt. % HF) at room temperature two times for 1 hour each time. This formed the microporous carbon. The resultant template-free carbon materials were filtered from the solution, washed thoroughly with deionized water and dried at 373 K overnight.

Figure 4:
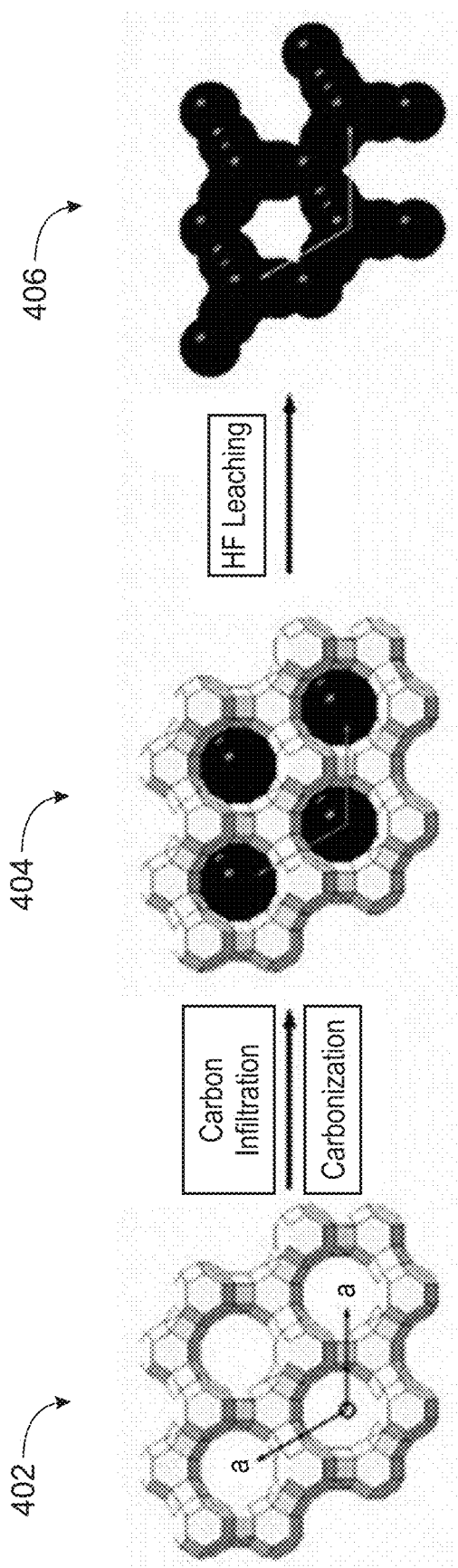
FIG. 4 is a schematic diagram of the synthesis of the zeolite templated carbon (ZTC)

FIG. 4 is a schematic diagram of the synthesis of the zeolite templated carbon (ZTC). As used herein, the ZTC may also be termed microporous carbon. The zeolite 402 may be treated, for example, with ion exchange, to form CaX. As shown in FIG. 4, the zeolite 402 has carbon deposited in the pores of the zeolite through carbon infiltration and carbonization. This forms a carbon/zeolite nano composite 404. The carbon/zeolite nano composite 404 is exposed to an acidic leaching using HCl/HF to form the ZTC 406.

Optimization of Organic Precursor for Carbon Replication of CaX

Figure 5:
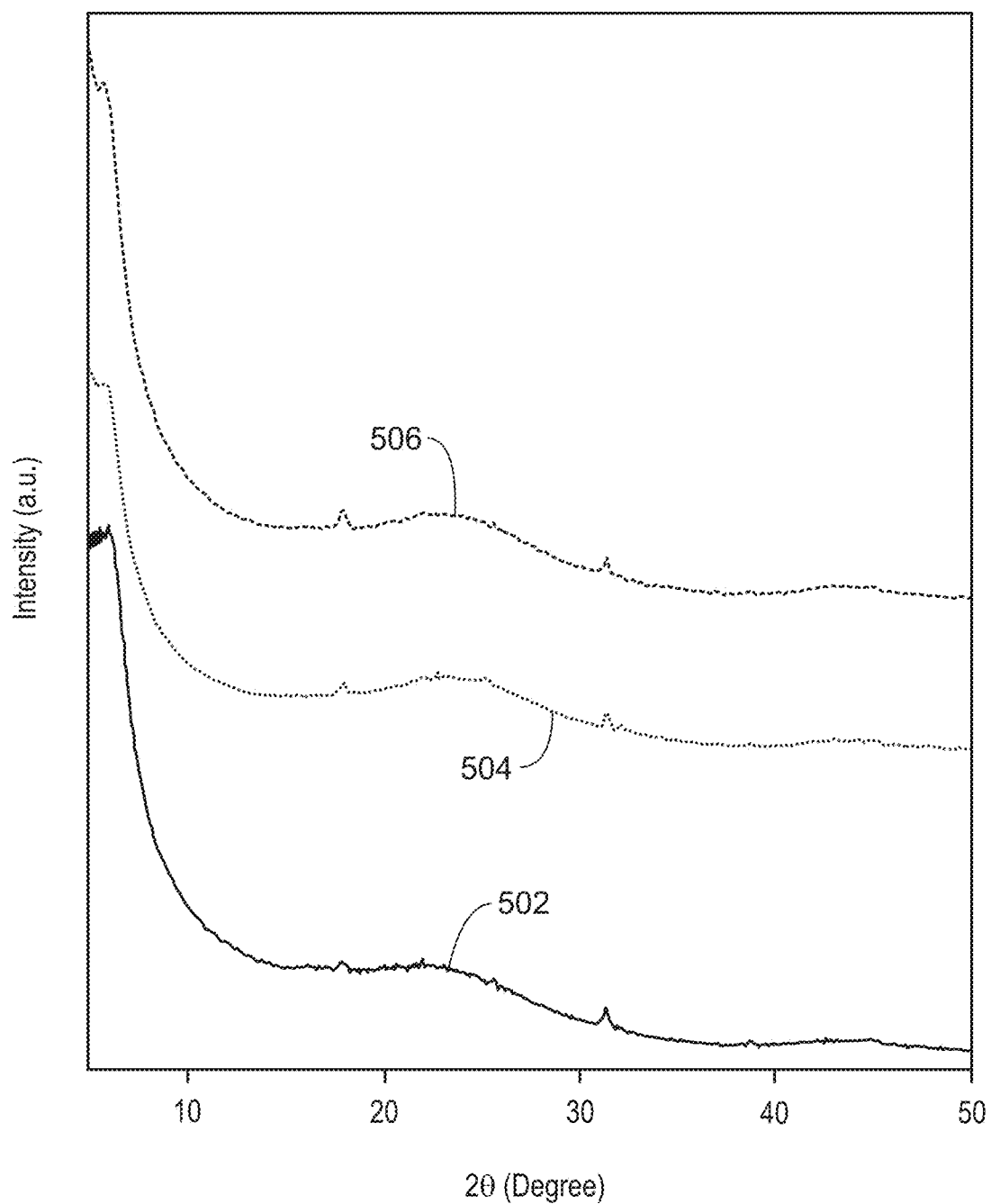
FIG. 5 is an XRD plot of the results for the different ZTCs formed.

FIG. 5 is an X-ray powder diffraction (XRD) plot 500 of the results for different ZTCs formed. As used herein, XRD is used for phase identification of a crystalline material and can provide information on unit cell dimensions. The material to be analyzed is finely ground, homogenized, and an average bulk composition is determined. XRD is the used to characterize the structure. To optimize the CVD conditions for carbon deposition in CaX, two different carbon precursors, propylene and ethanol, were deposited at different temperatures. In FIG. 5, and the description herein, the resultant ZTCs will be designated as CaX-tttNx where CaX indicates the zeolite template, ttt indicates temperature of the CVD in kelvin (K), N represents the organic precursor gas, e.g., P for propylene, E for ethanol, or A for acetylene. The term x indicates the CVD reaction time in hours. Accordingly, CaX-973P5-C 502 is a ZTC formed using CaX as the template at a CVD deposition temperature of 973 K, using propylene as the organic precursor gas for a CVD reaction time of 5 hours. Further, if the template has been removed, this is indicated by the addition of -C at the end of the designation. Other ZTCs shown in FIG. 4 include CaX-973E6-C 504 and CaX-1073E6-C 506. As described with respect to the nomenclature above, the latter two were both formed using ethanol as the organic precursor gas at a temperature of 973 K and 1073 K, respectively.

As shown in the XRD plot 500, the ZTCs formed using the CaX as a template have a broad peak around a 2θ of about 5° to about 6° which indicates presence of structural order in the arrangement of the micropores. The CaX-973P5-C 502 showed the most highly resolved peak at a 2θ of about 5° to about 6°, indicating the most faithful replication of the zeolite structure. As used herein, the reference numbers in the XRD plot 500, e.g., 502, 504, and 506, refer to the particular structures, and are used to indicate the same structures in the following plots.

Figure 6B:
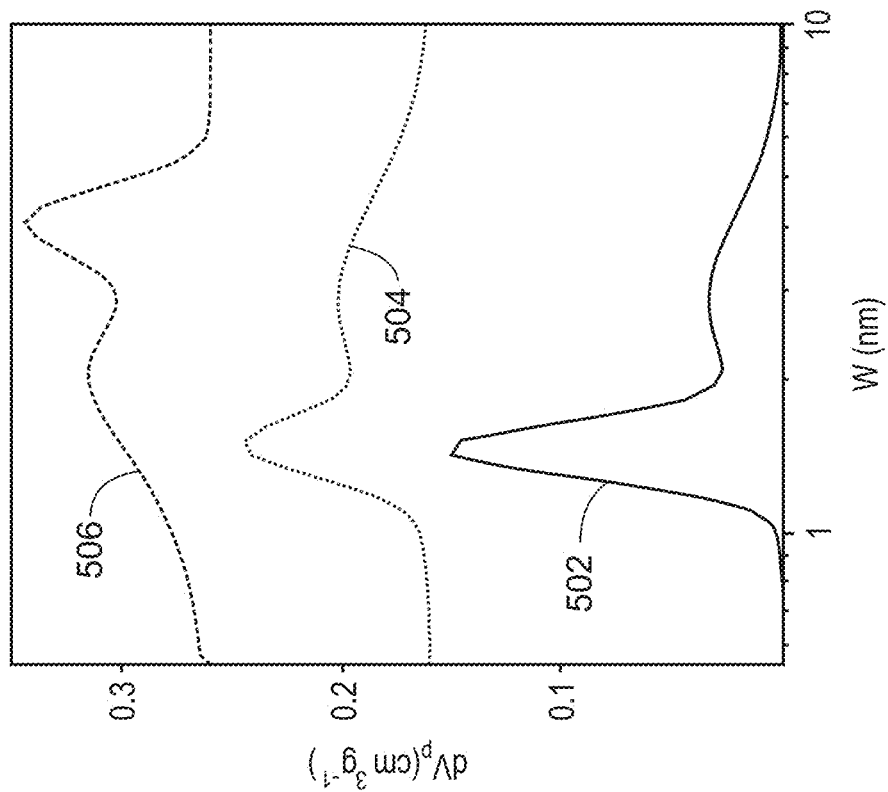
FIG. 6B is a plot of the pore size distribution of the ZTCs using an NLDFT algorithm.
Figure 6A:
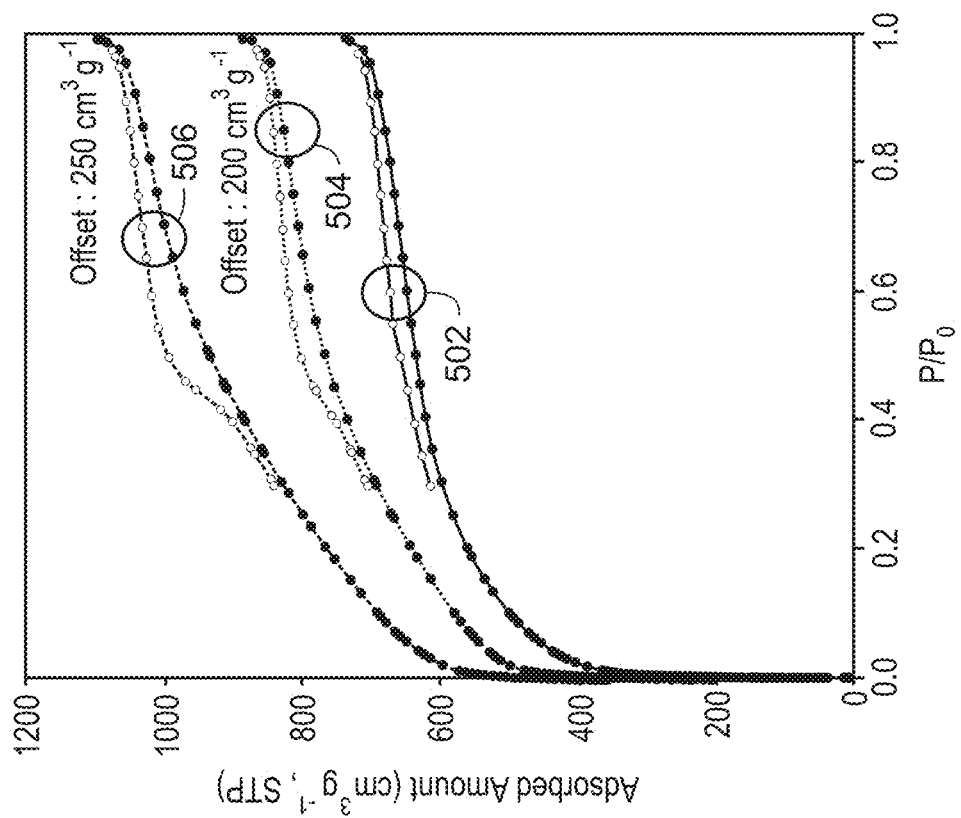
FIG. 6A is a plot of $N_2$ adsorption/desorption isotherms for the three different ZTCs.

FIG. 6A is a plot of $N_2$ adsorption/desorption isotherms for the three different ZTCs. In each of these plots, and the following plots, filled circles represent values collected during the pressure increase process, and open circles represent values during the pressure decrease process. Each group of one filled circle and one open circle represents one cycle of adsorption and desorption. FIG. 6B is a plot of the pore size distribution of the ZTCs using a non-local density functional theory (NLDFT) algorithm. As known in the art, density functional theory (DFT) is a quantum mechanical modeling process used to determine structural features from quantum mechanical calculations. Like numbered plots use the same reference numbers for referring to materials as in FIG. 5.

As shown in the $N_2$ adsorption/desorption isotherms of FIG. 6A (Table 2), the carbon materials showed dual porosity, with micropores of about 1.5 nm to about 2 nm in diameter, and mesoporosity, with pores of about 2 nm to about 5 nm. Since the initial CaX contained only microporous structure, the presence of mesopores, e.g., less than about 0.40 cm$^3$ g$^{-1}$, indicates a poor replication of the microporous structure of the zeolite. The presence of the mesopores in the carbon replicas can be attributed to incomplete filling of the zeolite micropores with carbon.

The organic precursor may not diffuse into the zeolite micropores above a certain level of carbon filling, due to steric effects. Thus, better carbon filling, leading to higher surface area and micropore volume, may be achieved using a smaller carbon precursor such as acetylene. In Table 2, it can be noted that sample CaX-1023A2-C exhibited much higher surface area (2567 m$^2$ g$^{-1}$) than the samples prepared with propylene (1900 m$^2$ g$^{-1}$) and ethanol (1792 m$^2$ g$^{-1}$). Furthermore, CaX-1023A2-C showed the highest micropore volume (1.09 cm$^3$ g$^{-1}$).

TABLE 2

BET surface area and pore volumes of carbon replicas.

| Sample | $S_{BET}$[1] (m$^2$g$^{-1}$) | $V_{micro}$[2] (cm$^3$g$^{-1}$) | $V_{meso}$[2] (cm$^3$g$^{-1}$) | $V_{total}$[2] (cm$^3$g$^{-1}$) |
|---|---|---|---|---|
| CaX-973P5-C | 1915 | 0.75 | 0.34 | 1.09 |
| CaX-973E6-C | 1596 | 0.58 | 0.48 | 1.06 |
| CaX-1073E6-C | 1826 | 0.65 | 0.66 | 1.31 |
| CaX-1023A2-C | 2567 | 0.95 | 0.42 | 1.37 |

[1]Brunauer-Emmett-Teller (BET) surface area.
[2]Micropore volume ($V_{micro}$) calculated using DR equation.

Optimization of CVD Conditions for Acetylene Incorporation into CaX Zeolites

The results in Table 2 indicate that acetylene is most suitable for the faithful carbon replication of zeolite. This is likely due to acetylene having the smallest kinetic diameter (0.33 nm) and the highest C/H ratio. The carbon replica synthesized by CVD using acetylene at 1023 K for 2 h showed relatively high BET surface area (2567 m$^2$ g$^{-1}$) and large micropore volume (>1.00 cm$^3$ g$^{-1}$). Such synthesis results, however, were difficult to reproduce especially when a larger amount of zeolite template (>1 g) is used for carbon CVD. The limitations in reproducibility and scale-ups have been the main obstacles for the practical application of the zeolite-templated carbon materials.

Properties of ZTC Replicated from Large Crystallite CaX (LCaX)

The techniques described above were used to synthesize ZTC from CaX having a large crystallite size, for example, between about 10 μm to about 20 The zeolite itself is designated as LCaX 702 in data and plots herein. The resulting structural properties are shown in Table 3. Hereinafter, the samples synthesized using the larger-crystal CaX will be denoted with a prefix of LCaX to differentiate from samples synthesized using CaX having small crystallites (about 2 μm or less). Thus, the samples will be denoted with the nomenclature of "zeolite template-CVD temperature-CVD time-heat treatment-template". For example, LCaX-873-4H-C indicates a microporous carbon sample synthesized by CVD with acetylene at 873 K for 4 h and heat treated, followed by removal of the zeolite template. LCaX-873-4H4H-C sample is similarly synthesized by repeating the cycle of 4 h acetylene CVD/heat treatment twice.

TABLE 3

Pore structural properties of the carbons replicated from of larger-crystal CaX

| Entry | Sample | $S_{BET}$[1] (m$^2$g$^{-1}$) | $V_{micro}$[2] (cm$^3$g$^{-1}$) | $V_{meso}$ (cm$^3$g$^{-1}$) | $V_{total}$ (cm$^3$g$^{-1}$) | Ref. Nos. in plots |
|---|---|---|---|---|---|---|
| 1 | LCaX-1023-2-C [3] | 2567 | 0.95 | 0.42 | 1.37 | 802[5] |
| 2 | LCaX-1023-2-C [4] | 2156 | 0.83 | 0.43 | 1.26 | |
| 3 | LCaX-973-3-C [3] | 2381 | 0.93 | 0.31 | 1.24 | |
| 4 | LCaX-873-4-C [3] | 841 | 0.33 | 0.12 | 0.45 | 704[5] |
| 5 | LCaX-873-4H-C [3] | 3049 | 1.12 | 0.45 | 1.57 | 706[5] |
| 6 | LCaX-873-4H4H-C [3] | 2830 | 1.10 | 0.23 | 1.33 | 708[5] |
| 7 | LCaX-873-4H4H-C [4] | 2840 | 1.12 | 0.21 | 1.33 | |
| 9 | LCaX-823-9H4H-C [4] | 2950 | 1.17 | 0.18 | 1.35 | |

Figure 7:
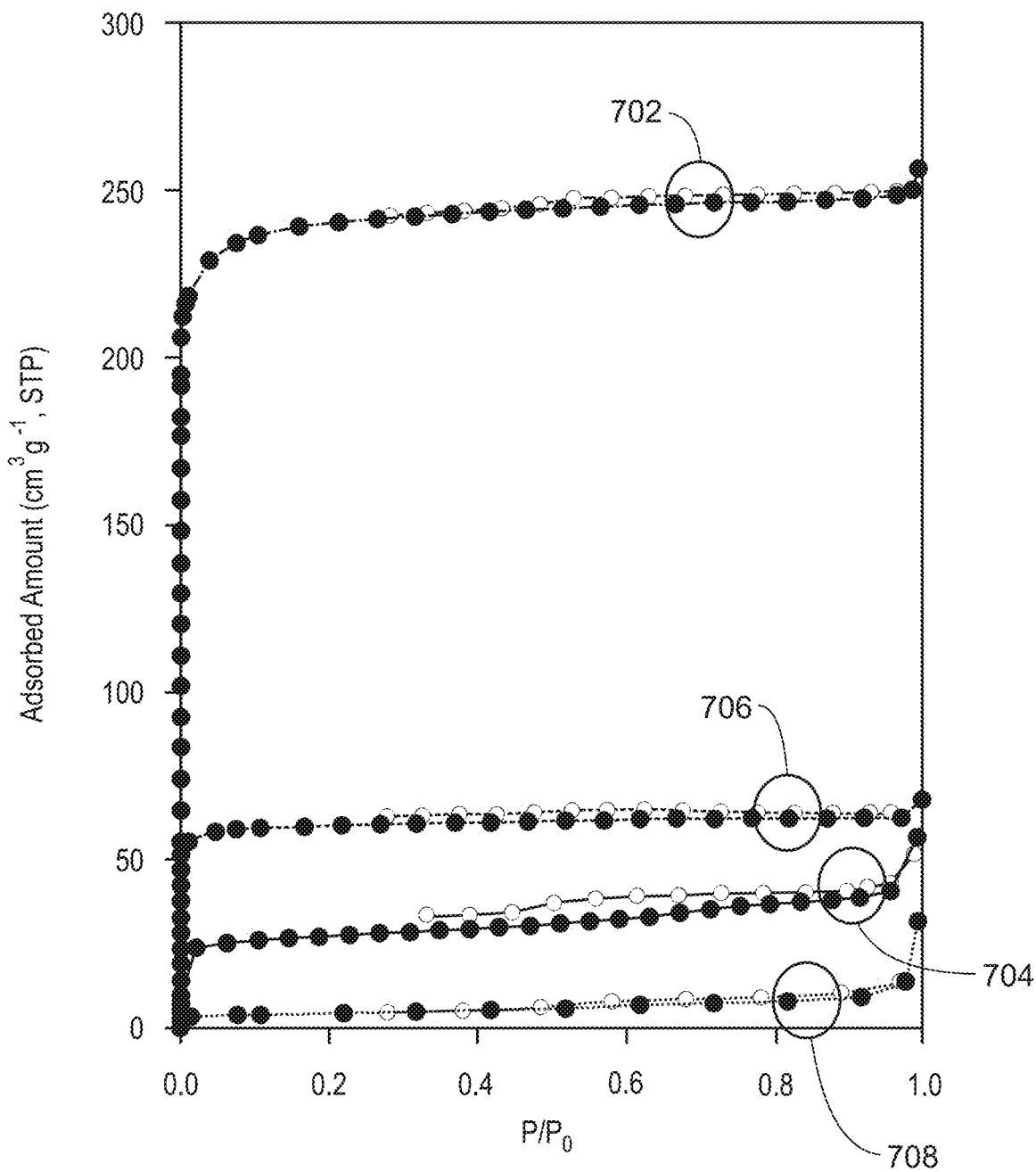
FIG. 7 is a plot of the $N_2$ adsorption-desorption isotherms of zeolite-carbon composite (without zeolite template removal) collected at the different steps of the synthesis process.

[1]Brunauer-Emmett-Teller (BET) surface area.
[2]Micropore volume ($V_{micro}$) calculated using DR equation.
[3] 1 g zeolite is used for acetylene CVD.
[4] 5 g zeolite is used for acetylene CVD.
[5]Plots in FIGS. 7 are without zeolite template removal, plots in FIG. 8 are after zeolite template removal.

The results in entries 1, 3 and 4 showed that higher CVD temperature is useful for obtaining higher surface area and micropore volume. The carbon synthesized at relatively low temperature (873 K, entry 4) showed significantly lower surface area than other samples, which indicates that carbon structure is not sufficiently graphitized (or rigid) at 873 K and thus collapsed after removal of zeolite template. The result also shows that only highly graphitized carbon structure can retain highly microporous structure. Unfortunately, such high-temperature acetylene CVD is very sensitive to the starting amount of zeolite template, e.g., the bed thickness in the fixed-bed reactor. If the amount of zeolite is increased from 1 to 5 g, as shown by the comparison of entries 1 and 2, for CVD using acetylene, the BET surface area and porosity of the resultant carbon decreased significantly.

To overcome this problem, a sequential carbon synthesis procedure is described herein, which is composed of low-temperature acetylene CVD (<873 K) and high-temperature heat treatment (1123 K) under noble gas (He). At low CVD temperature (<873 K), carbon deposition occurs very uniformly over the zeolite bed. After the micropore of the zeolite is fully filled with non-graphitized carbon, the gas stream is switched to He and the temperature is increased to 1123 K for the graphitization (densification) of the carbon structure. Such consecutive steps allow uniform and selective deposition of high graphitized carbons inside the zeolite micropores. In result, LCaX-873-4H-C (entry 5) shows very high surface area of 3049 $m^2\ g^{-1}$ and micropore volume of 1.12 $cm^2\ g^{-1}$, even surpass those of sample LCaX-1023-2-C 802 (entry 1, FIGS. 8A-8C).

FIG. 7 is a plot 700 of the $N_2$ adsorption-desorption isotherms of zeolite-carbon composite (without zeolite template removal) collected at the different steps of the synthesis process. All measurements are in comparison to the microporosity of the LCaX 702. After the acetylene CVD at 873 K for 4 h (LCaX-873-4 704), negligible microporosity remains inside the zeolite template. This indicates that the zeolite micropore is fully filled with the non-graphitized carbon framework. After thermal treatment at 1123 K for 4 h under He (LCaX-873-4H 706), c.a. 25% of the zeolite micropore volume is regenerated. The result reveals that the thermal treatment led to the densification and hence the volume shrinkage of carbon framework inside the zeolite micropores. Because the considerable fraction of zeolite micropores are regenerated after the thermal treatment, a secondary CVD/thermal treatment cycle using acetylene can be carried out to fill the remaining micropores. After repeating the CVD-thermal treatment cycle twice (LCaX-873-4H4H 708), the micropore of zeolite template are nearly fully filled with the graphitized carbon framework. After the removal of zeolite template, the repeated CVD/thermal treatment cycles significantly reduce the carbon mesopore volume while retaining the BET surface area: LCaX-873-4H4H-C 708 (0.23 $cm^3\ g^{-1}$) showed significantly reduced mesopore volume than LCaX-873-4H-C 706 (0.45 $cm^3\ g^{-1}$), as seen by comparing entries 5 and 6 in Table 3.

The result indicates that incomplete filling of zeolite micropores leads to the formation of mesopores in the replicated carbon structure. It can be noted that the sequential carbon synthesis procedure allows high reproducibility of the carbon structure regardless of the zeolite amount (bed thickness) used for the carbon synthesis (compare entries 6 and 7).

Decreasing the initial acetylene CVD temperature from about 873 K to about 823 K, the carbon can be synthesized (entry 9) with slightly enhanced BET surface area and micropore volume. Based on these results, an optimum temperature range for initial acetylene CVD is between about 823 K to about 873 K. At CVD temperatures lower than 773 K, the carbon deposition was too slow for practical application.

Figure 8A:
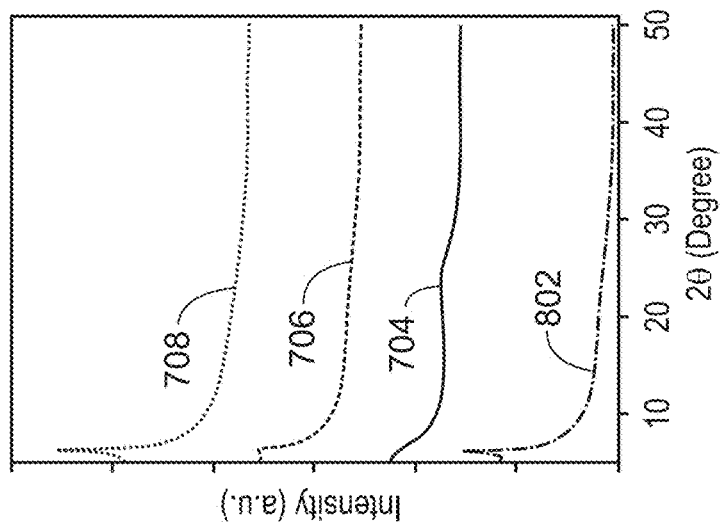
FIGS. 8A to 8C show the $N_2$ adsorption isotherms and XRD patterns for the representative samples in Table 3.
Figure 8B:
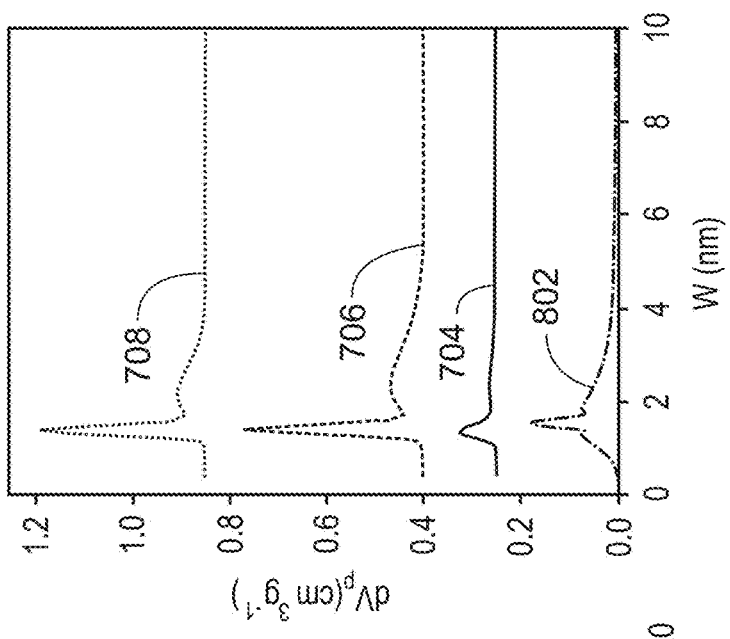
Figure 8C:
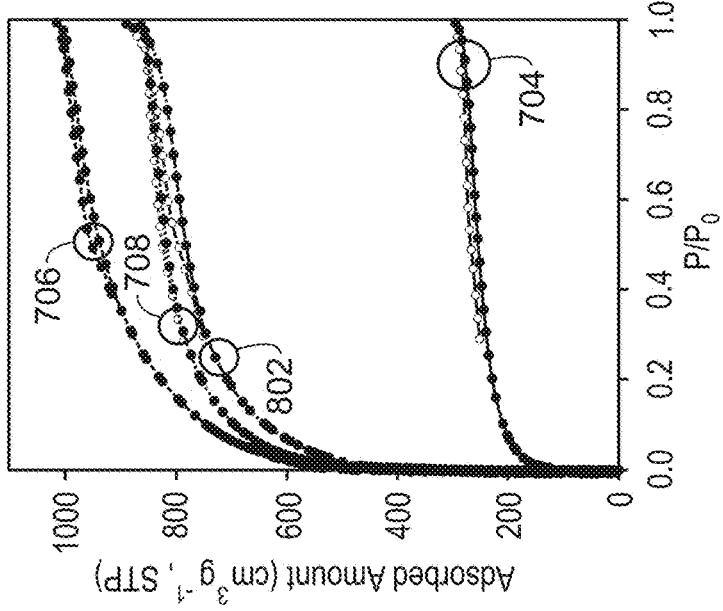

FIGS. 8A to 8C show the $N_2$ adsorption isotherms and XRD patterns for the representative samples in Table 3. It is noteworthy that the most faithfully replicated carbon structure (LCaX-873-4H4H-C 708) shows a Type I isotherm with small amount of $N_2$ adsorption at high pressure regime ($P/P_0$>0.1). LCaX-873-4H-C 706 sample synthesized by single cycle of acetylene CVD/thermal treatment showed even higher total pore volume than the sample of LCaX-873-4H4H-C 708, but the enhancement is only due to the presence of secondary mesoporosity, as indicated by the more pronounced adsorption at $P/P_0$>0.1. The samples synthesized by subsequent acetylene CVD-heat treatment cycle, LCaX-873-4H-C 706 and LCaX-873-4H4H-C 708, showed much narrower and more intense pore size distribution in the micropore regime (W<2 nm). It can be noted that the replicated carbon (LCaX-873-4H4H-C 708) showed a very sharp peak at 2θ=6.3° in XRD. This indicates that the replicated carbon has ordered microporous structure like zeolite. Therefore, the presence of the sharp XRD peak at 2θ=6.3° can be used as an indicator for evaluating the replication of zeolite structure, e.g., the efficiency of the carbon deposition.

ZTC Functionalization.

Figure 9:
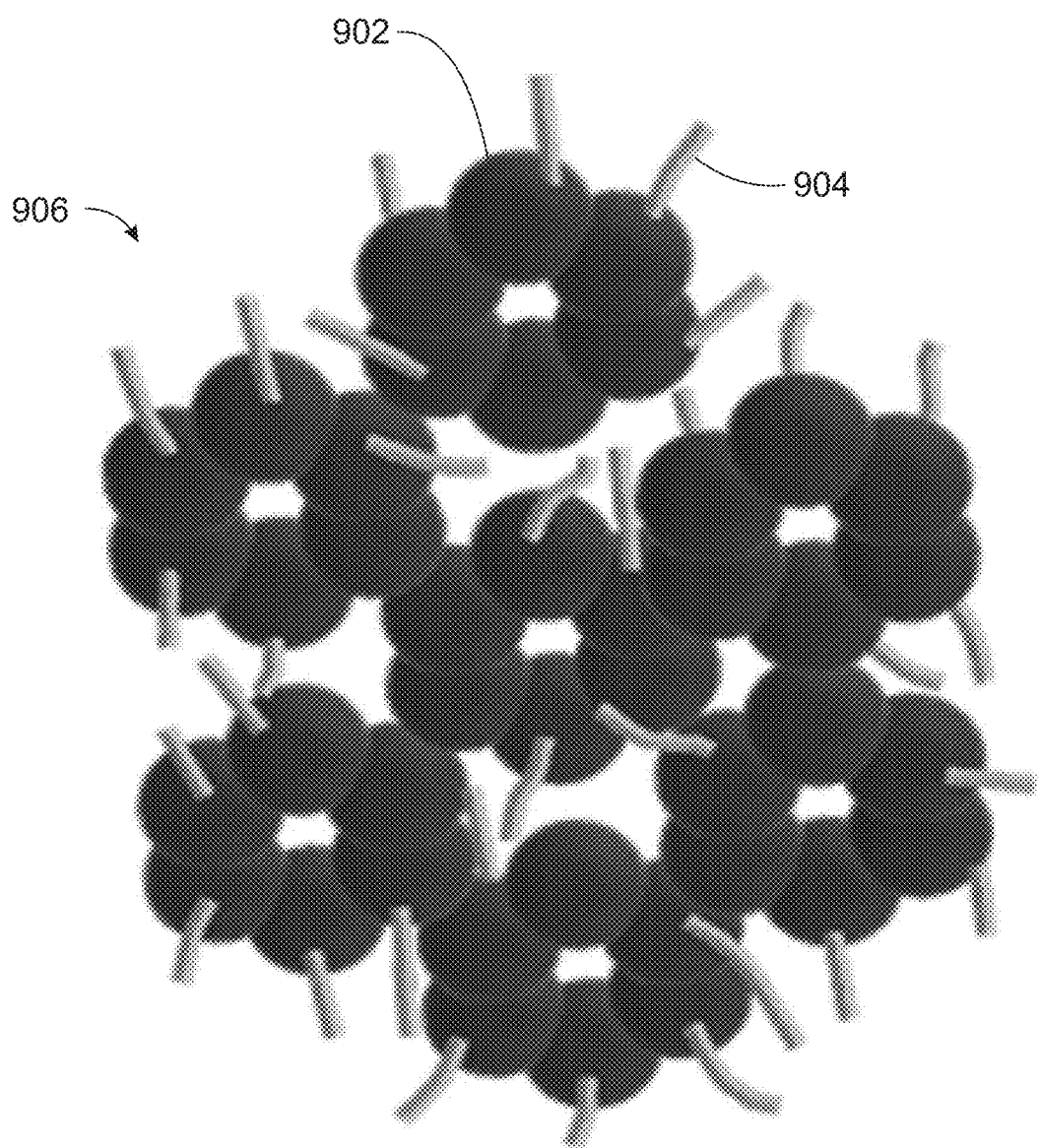
FIG. 9 is a drawing of a ZTC impregnated with catalyst particles forming a functionalized ZTC.

FIG. 9 is a drawing of a ZTC 902 impregnated with catalyst particles 904 forming a functionalized ZTC 906. In the example described herein, wet impregnation can be used to load a noble metal, such as platinum, onto a ZTC 902 support to function as a catalyst. For example, to impregnate Pt, a solution of $Pt(NH_3)(NO_3)_2$ can be prepared using the desired amount. In various embodiments, the amount can range from 0.1 wt % to 5 wt %. In some embodiments, 3 wt % is used, a solution volume equivalent to the pore volume of the ZTC 902 used is added to wet the ZTC 902. The impregnated ZTC is dried in oven at 80° C. overnight. The dried Pt/ZTC is then calcined under a $N_2$ flow at a flow rate of 50 ml/min. This can be performed at 500° C. for 12 hours to decompose the metal nitrates. After decomposition of the metal nitrates, the Pt/ZTC can be reduced in flowing hydrogen, for example, at a flow rate of 50 ml/min for 2 hours at 500° C., to produce dispersed Pt or catalyst particles 904 on the ZTC 902, herein termed functionalized ZTC 906.

In some embodiments, a strong electrostatic adsorption (SEA) method is used. In this method, impregnation is controlled by adjusting the pH of the carbon/water/precursor slurry to the adequate value to increase the electrostatic interactions between the metal precursor and the support are maximized.

Incorporating Functionalized ZTC into Electrode

After impregnation of the catalyst particles, the functionalized ZTC is added to the electrodes. In an embodiment, the functionalized ZTC can be adhered to the electrodes using a mixture that includes the functionalized ZTC with a perfluorinated resin binder (e.g., Nafion® at about 5 wt %) and isopropyl alcohol (70 wt %) as a conductive adhesive.

Figure 10:
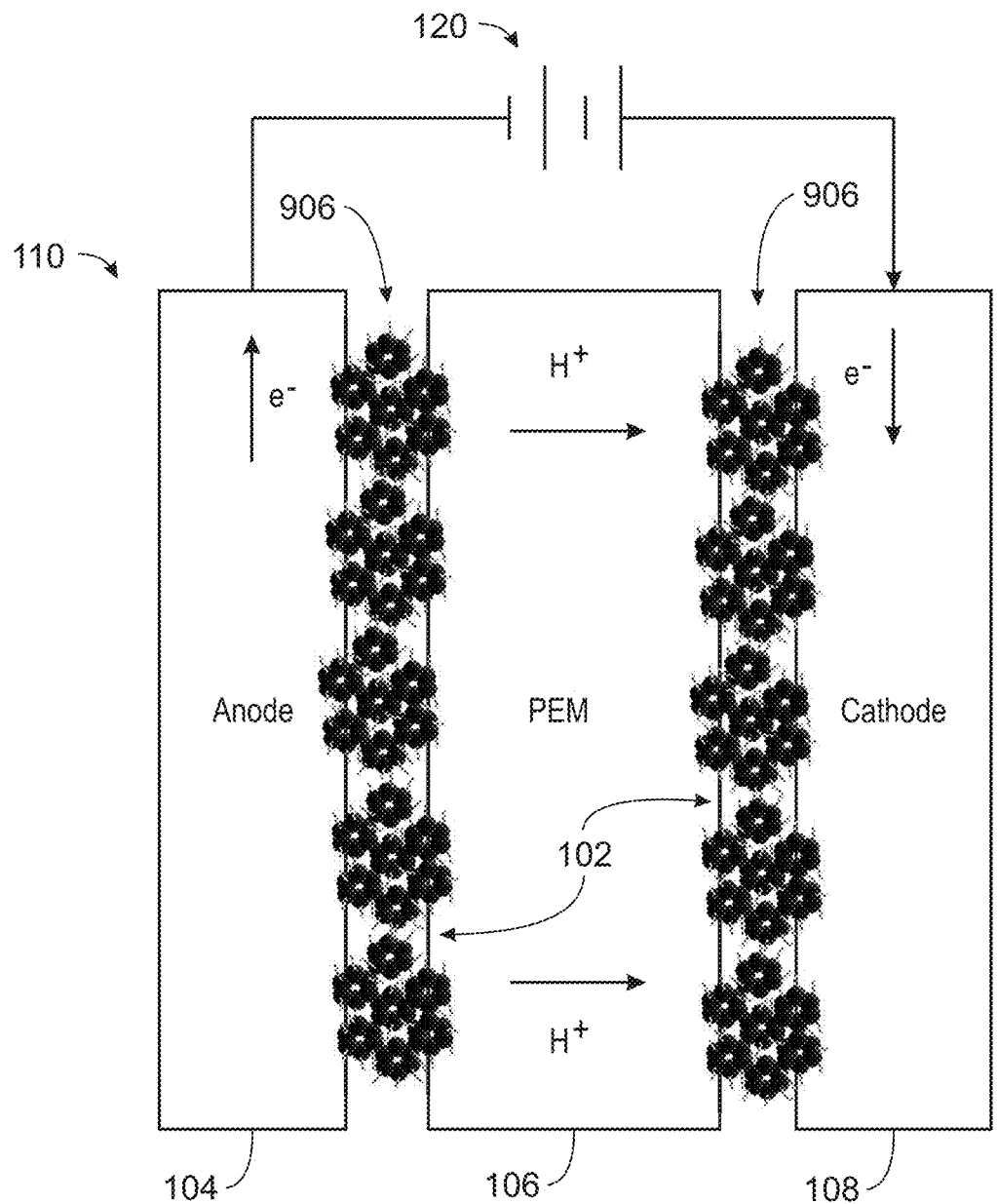
FIG. 10 is a schematic drawing of an MEA with the functionalized ZTC incorporated into the interfaces between the PEM and the anode and the cathode

Membrane Electrode Assembly (MEA) Preparation:

FIG. 10 is a schematic drawing of an MEA 110 with the functionalized ZTC incorporated into the interfaces between the PEM and the anode and the cathode. Like numbered items are as described with respect to FIG. 1.

In some embodiments, the MEA 110 is prepared by hot pressing the anode, PEM, and cathode together, for example, under about 1 to 2 metric tonnes of pressure for 3 min at 100-120° C. A polymer solution of perfluorinated ion-exchange resin (Nafion®), or other ion-exchange resins, is applied to the surface of both anodic and cathodic electrodes, prior to the pressing. For example, a 5 wt. % solution of the ion-exchange resin in a solution or dispersion with lower aliphatic alcohols/$H_2O$. The polymer solution may help with the mechanical stability of the MEA 110 and the proton conductivity in the catalytic layer.

PEM Electrolytic Cell Assembly

The final PEM electrolytic cell assembly 100, shown in FIG. 1, is made by mounting the MEA 110 (FIGS. 1 and 9) into a housing 112. As described herein, in various embodiment, the MEA 110 is sealed to the housing with a high temperature sealant, such as a silicone adhesive, or an epoxy, among others.

As described herein, in various embodiments, heating systems 128 in the MEA 110 are coupled to heat sources. These are used to add heat to the MEA 110 to keep the temperature in the operating temperature range during electrolysis. In some embodiments, the water 114 is provided as steam, which provides sufficient heat to the PEM electrolytic cell for operations. In these embodiment, the heating system may not be present, or may only be used for startup.

EMBODIMENTS

An embodiment described in examples herein provides a method for making a polymer electrolyte membrane (PEM) electrolytic cell assembly. The method includes forming a functionalized zeolite templated carbon (ZTC), including forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites, forming the functionalized ZTC. The method further includes incorporating the functionalized ZTC into electrodes, forming a membrane electrode assembly (MEA), and forming the PEM electrolytic cell assembly. The method further includes coupling the PEM electrolytic cell assembly to a heat source.

In an aspect, the CaX zeolite is formed by ion exchanging a NaX zeolite with calcium ions.

In an aspect, the CVD process uses propylene, ethanol, or acetylene, or any combinations thereof, as an organic precursor gas. In an aspect, wherein the CVD process uses acetylene as an organic precursor gas. In an aspect, the acetylene is added as a 2 vol. % solution in helium. In an aspect, the CVD process is performed at a temperature of between 823 K and 1123 K.

In an aspect, the CVD process includes depositing carbon in a matrix of the CaX zeolite at a first temperature using a gas stream including acetylene, switching the gas stream to a helium stream, and increasing the first temperature to a second temperature. In an aspect, the first temperature is less than 875 K. In an aspect, the first temperature is about 823 K. In an aspect, the second temperature is greater than 1120 K. In an aspect, the second temperature is about 1123 K.

In an aspect, the method includes repeating the CVD process. Repeating the CVD process includes cooling back to the first temperature, switching the gas stream back to the gas stream including acetylene, depositing carbon in the matrix of the CaX zeolite at the first temperature, switching the gas stream to the helium stream, and increasing the first temperature to the second temperature.

In an aspect, the method includes forming the functionalized ZTC using an incipient wetness technique. In an aspect, the method includes dissolving an active metal precursor to form an aqueous solution, adding an amount of the aqueous solution to the ZTC corresponding to a pore volume of the ZTC forming a metal/ZTC composite, drying the metal/ZTC composite, and sintering the metal/ZTC composite to form the functionalized ZTC.

In an aspect, the method includes adhering the functionalized ZTC to a surface of an anode, a cathode, or both, using an ion conductive adhesive.

In an aspect, the method includes incorporating the functionalized ZTC into an anode, a cathode, or both by sputtering.

In an aspect, the method includes forming the MEA by pressing an anode, a PEM, and a cathode together in a hot press, wherein a surface of the anode facing the PEM, a surface of the cathode facing the PEM, or both, is coated with the functionalized ZTC.

In an aspect, the method includes forming the PEM electrolytic assembly by mounting the MEA in a housing with an inlet for steam.

Another embodiment described in examples herein provides a polymer electrolyte membrane electrolytic cell. The polymer electrolyte membrane electrolytic cell includes a membrane electrode assembly (MEA) that includes an anode, a polymer electrolyte membrane (PEM), and a cathode, wherein the anode, the cathode, or both includes functionalized zeolite templated carbon (ZTC). The PEM electrolytic cell also includes a housing including an inlet for water and an outlet for hydrogen and a power line coupled to the cathode to provide current to the PEM electrolytic cell from an external power supply. The PEM electrolytic cell includes a return line from the external device coupled to the anode.

In an aspect, the PEM electrolytic cell includes a layer of functionalized zeolite template carbon disposed at the interface between the anode and the PEM, the interface between the cathode and the PEM, or both.

In an aspect, the functionalized ZTC is formed by a method including forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites, forming the functionalized ZTC.

Other implementations are also within the scope of the following claims.

What is claimed is:

1. A polymer electrolyte membrane (PEM) electrolytic cell, comprising:
   a membrane electrode assembly (MEA), comprising:
   an anode;
   a polymer electrolyte membrane (PEM); and
   a cathode, wherein the anode, the cathode, or both comprises functionalized zeolite templated carbon (ZTC) comprising catalyst particles, micropores and mesopores, wherein the catalyst particles are disposed in the micropores and mesopores, the micropores have a diameter of from about 1.5 nm to about 2 nm, and the mesopores have a diameter of from about 2 nm to about 5 nm and a mesopore volume of about 0.12 $cm^3$/g to about 0.48 $cm^3$/g;
   a housing comprising an inlet for water and an outlet for hydrogen;
   a power line coupled to the cathode to provide current to the PEM electrolytic cell from an external power supply; and
   a return line from the external power supply coupled to the anode.

2. The PEM electrolytic cell of claim 1, comprising a layer of functionalized zeolite template carbon disposed at the interface between the anode and the PEM, the interface between the cathode and the PEM, or both.

3. The PEM electrolytic cell of claim 1, wherein the functionalized ZTC is formed by a method comprising:
   forming a CaX zeolite having a crystallite size of about 10 μm to about 20 μm;
   depositing carbon in the CaX zeolite using a chemical vapor deposition (CVD) process to form a carbon/zeolite composite;
   treating the carbon/zeolite composite with a solution comprising hydrofluoric acid to form a ZTC; and
   treating the ZTC to add catalyst sites, forming the functionalized ZTC.

4. The PEM electrolytic cell of claim 3, wherein the carbon deposited in the CaX zeolite is originated from a precursor selected from propylene, ethanol and acetylene.

5. The PEM electrolytic cell of claim 3, wherein the solution further comprises hydrochloric acid.

6. The PEM electrolytic cell of claim 1, wherein the functionalized ZTC has a micropore volume of about 0.58 $cm^3/g$ to about 1.17 $cm^3/g$.

7. The PEM electrolytic cell of claim 6, wherein the functionalized ZTC has a mesopore volume of about 0.12 $cm^3/g$ to about 0.48 $cm^3/g$.

8. The PEM electrolytic cell of claim 1, wherein the functionalized ZTC has a micropore volume of about 0.33 $cm^3/g$ to about 1.17 $cm^3/g$.

9. The PEM electrolytic cell of claim 8, wherein the functionalized ZTC has a mesopore volume of about 0.12 $cm^3/g$ to about 0.45 $cm^3/g$.

10. The PEM electrolytic cell of claim 1, wherein the functionalized ZTC has a mesopore volume of about 0.12 $cm^3/g$ to about 0.45 $cm^3/g$.

11. The PEM electrolytic cell of claim 1, wherein the functionalized ZTC has a micropore volume of about 0.34 $cm^3/g$ to about 0.66 $cm^3/g$.

12. The PEM electrolytic cell of claim 11, wherein the functionalized ZTC has a mesopore volume of about 0.34 $cm^3/g$ to about 0.66 $cm^3/g$.

13. The PEM electrolytic cell of claim 1, wherein the functionalized ZTC has a total pore volume of about 0.45 $cm^3/g$ to about 1.57 $cm^3/g$.

14. The PEM electrolytic cell of claim 1, wherein the functionalized ZTC has a Brunauer-Emmett-Teller (BET) surface area of about 840 to about 3050 $m^2/g$.

15. The PEM electrolytic cell of claim 1, wherein the functionalized ZTC is adhered to a surface of the anode or the cathode via a conductive adhesive comprising a perfluorinated resin binder and an alcohol.

* * * * *